United States Patent [19]

Dupont et al.

[11] Patent Number: 5,206,632
[45] Date of Patent: Apr. 27, 1993

[54] ACTUATING CIRCUIT FOR A LIQUID CRYSTAL DISPLAY

[75] Inventors: Antoine Dupont, Villingen; Michael Maier, Bad Peterstal-Griesbach, both of Fed. Rep. of Germany; Bernard Hepp, Neuilly, France; Eric Benoit, Schwenninen, Fed. Rep. of Germany

[73] Assignee: Deutsche Thomson-Brandt GmbH, Villingen-Schwenningen, Fed. Rep. of Germany

[21] Appl. No.: 580,462

[22] Filed: Sep. 11, 1990

[30] Foreign Application Priority Data

Sep. 11, 1989 [DE] Fed. Rep. of Germany ....... 3930259

[51] Int. Cl.[5] .............................................. G09G 3/36
[52] U.S. Cl. .................................... 340/784; 340/805
[58] Field of Search .............. 340/784, 805, 825, 79, 340/825.8; 350/332, 333

[56] References Cited

U.S. PATENT DOCUMENTS 3,824,003  7/1974  Koda et al. ......................... 350/333
4,714,921  12/1987 Kanno et al. .
4,750,813  6/1988  Ohwada et al. .
4,830,467  5/1989  Inoue et al. ......................... 350/333

FOREIGN PATENT DOCUMENTS 293235  11/1988  European Pat. Off. .
306011  3/1989   European Pat. Off. .
8701849 3/1987   PCT Int'l Appl. .
2162984 2/1986   United Kingdom .
2175119 11/1986  United Kingdom .

OTHER PUBLICATIONS

Addy et al., "Addressing a liquid Crystal Cell", IBM Technical Disclosure Bulletin, vol. 22, No 6, Nov. 1979, pp. 2507-2508.

Primary Examiner—Ulysses Weldon
Attorney, Agent, or Firm—Spencer, Frank & Schneider

[57] ABSTRACT

An actuation circuit for a liquid crystal display includes a plurality of pixel elements constructed in the form of a matrix of columns and rows and a plurality of column capacitors connected to respective columns of the liquid crystal display that can be charged to store a signal to be displayed. The activation circuit comprises a number of blocks which each comprise a separate group of the columns forming the matrix of pixel elements, a corresponding number of column capacitors, and a plurality of data lines. The individual data lines receive respective signals and are connected to the column capacitors. A switch device is connected to each respective block for successively switching between the number of blocks. The signal to be displayed is fed in parallel through the data lines of the columns of a first block to charge respective column capacitors of the first block and after the charging of the column capacitors in the first block, the input lines are switched by the switch device to the data lines of the columns of the next-following block.

11 Claims, 6 Drawing Sheets

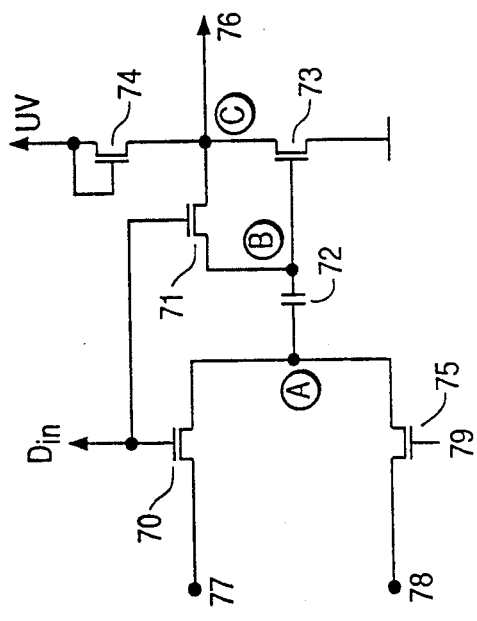
FIG. 6
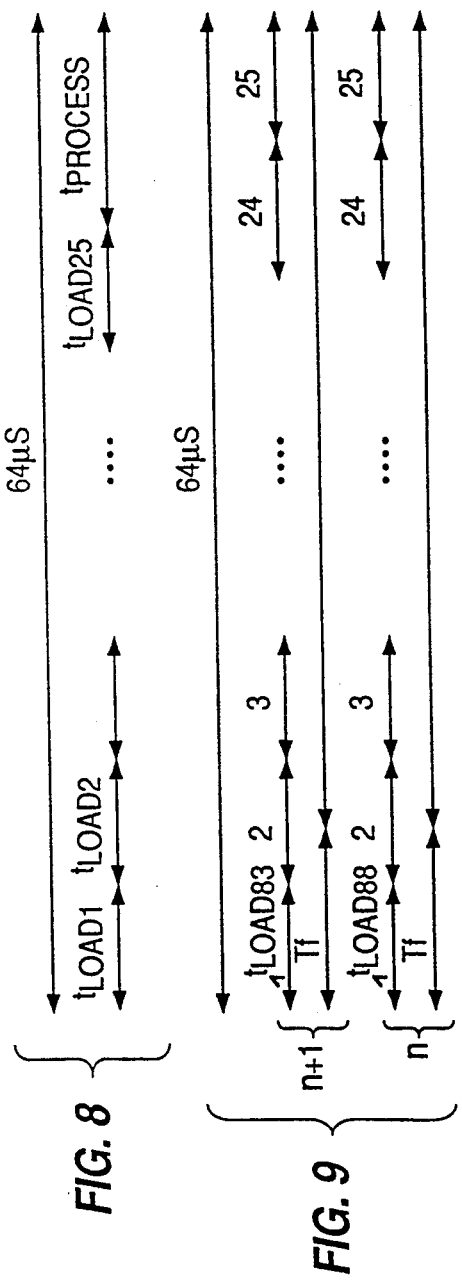
FIG. 8
FIG. 9

ACTUATING CIRCUIT FOR A LIQUID CRYSTAL DISPLAY

CROSS-REFERENCE TO RELATED APPLICATION

The present application claims the right of priority with respect to application serial no. P 39 30 259.8, filed Sep. 11th, 1989, in the Federal Republic of Germany, the disclosure of which is incorporated herein by reference.

BACKGROUND OF THE INVENTION

The present invention relates to an actuation circuit for a liquid crystal display including pixel elements that can be actuated to display a signal and are constructed in the form of a matrix M of columns and rows as shown in FIG. 1a.

Prior art liquid crystal displays include two substrates which are arranged at a defined distance from one another. Between the substrates there is a liquid crystal material. The substrates are selected in such a way that, depending on their use, one or both substrates are transparent. A transparent ground plane conductor is disposed on one of these substrates. The oppositely disposed substrate includes a matrix of individual electrode elements, called pixel electrodes. A semiconductor switch, preferably a thin-film transistor, is associated with each one of these pixel electrodes and is disposed on the substrate provided with these pixel electrodes. These transistor switches are made either of amorphous silicon or of polycrystalline silicon. Due to the lower processing temperatures, the amorphous silicon technology is preferable for consumer uses.

With reference to FIG. 1a the individual pixels 120 of the matrix M act as capacitors, with the liquid material serving as the dielectric substance. The application of a voltage to a pixel electrode controls the light transmittance of the liquid crystal material. The transformation or regrouping of the liquid crystals permits a display of text or graphic information which becomes visible on the device. Each pixel electrode has its own associated semiconductor switch 122 which can be turned on or off so that each individual pixel element can be controlled by signals supplied to its associated semiconductor switch.

Each semiconductor switching element or transistor 122 is disposed at the point of intersection between a column m and a row n of the matrix of pixel electrodes. The columns m are data lines, rows n are selection lines. The control gate electrode 124 of each transistor switch is connected with a selection line 126 and the source or drain electrode of the transistor switch is connected with a data line 128. The drain or source electrode is connected with the pixel electrode.

During a display operation, a line is written in that a signal level is constantly applied to each one of the data lines. The selection lines are continuously activated so that the voltages occurring in the data lines are applied by their respective semiconductor switching elements to the pixel electrodes. During playback, for example of picture information, the voltages representing, for example, gray values are applied to data lines and the selection lines are activated for the respective line to be written. After the necessary, short charging time for the liquid capacitor, another selection line is activated and the data voltages associated with this row are sequentially applied to the pixel columns. For television applications, this writing occurs from the top to the bottom in, for example, 1/25 or 1/50 of a second. Thus a complete picture is displayed on the screen in this time period.

In addition to the capacitance of the liquid crystal capacitor, there are parasitic capacitances which undesirably influence the signal transmission from the data lines to the liquid crystal capacitors. On the one hand, there are parasitic capacitances between the data lines and the pixel electrodes, and on the other hand, there are parasitic gate/source and gate/drain capacitances in the switching element itself. During operation of such a display, the voltage across one pixel is set during its purely addressing phase. The semiconductor switch is then blocked, and the voltage should remain constant until the line is rewritten during the renewed build-up of a picture.

A minimum charging time is required to charge the liquid crystal capacitor to the voltage value predetermined by the information in the data line and to charge the parasitic capacitances. This charging time cannot be reduced at will because of the low mobility of the amorphous silicon employed.

European Patent Application No. A1-0,298,255 discloses an actuation circuit for a liquid crystal display including an active matrix display and including signal driver circuits for the columns and rows. The column actuation circuit includes shift registers as well as two sample-and-hold circuits for each column. The data of a row are written sequentially into the first sample-and-hold circuit. Once a row has been written, its entire contents are transferred to the second sample-and-hold circuit which actuates the liquid crystal display elements. In this process, it is necessary to take care that the voltage of the previous columns is kept constant over a long period of time until the sample-and-hold circuit of the last column has been charged. Moreover, a separate connecting line is required for each column.

SUMMARY OF THE INVENTION

It is an object of the present invention to provide an actuation circuit for a liquid crystal display which keeps the charged voltage constant in a simple manner over a period of time and reduces the number of connecting lines.

This is accomplished by providing an actuation circuit for a liquid crystal display including a plurality of pixel elements which are arranged in a matrix of columns and rows, with the columns being grouped in a number of blocks, each block being composed of a separate group of the columns forming the matrix of pixel elements; a plurality of column capacitors that can be charged to store a signal to be displayed, each column capacitor being associated with a respective column of pixel elements; a plurality of data lines which receive input signals and are coupled to a respective one of the column capacitors; and first switch means for successively switching between the number of blocks wherein the signal to be displayed is fed in parallel through the respective data lines of a first block to charge the associated columns and after charging the columns of the first block, the signals are switched by the switch means to the columns of the next-following block.

Another embodiment of the invention further includes second switch means for charging all column capacitors in parallel and incorporates an intermediate storage circuit in which the signal to be displayed is intermediately stored block by block with the second switch means being coupled between the storage circuit and the column capacitors. This embodiment employs, in each column, a memory capacitor which initially receives the input signals to be displayed and is coupled to a respective column capacitor. After all the memory capacitors of a row have been charged, all the column capacitors of the respective row are charged simultaneously in parallel by a data signal.

To solve the above-mentioned problems associated with the prior art, the actuation circuit according to the invention is operated in multiplex. Before or after the data voltage is applied to a pixel element, the selection line of a respective row is switched on and then, or previous to that time, the data voltage is applied to the respective column. For this purpose, a number of columns are combined into blocks, with the video signal of each block being fed to the respective columns of the display element and the video signal being forwarded in blocks. This results in a charging time for each pixel element in such a multiplex operation being equal to the duration of the activation a row divided by the number of blocks. Since the number of blocks is considerably less than the number of columns, the charging time is considerably longer than previously available.

In order to avoid high peak currents and to realize a uniform brightness distribution over the entire width of the display, the video signal is intermediately stored and all capacitors of the individual columns of a block are charged in parallel.

BRIEF DESCRIPTION OF THE DRAWINGS

An embodiment according to the invention will be described with reference to the drawing figures in which:

FIG. 1b is a circuit schematic of the block SC in FIG. 1a;

FIG. 6 is a circuit schematic illustrating a circuit for storage and voltage/time conversion according to the invention;

FIG. 8 is a first time diagram used to explain the operation of the invention;

FIG. 9 is a second time diagram used to explain the operation of the invention;

DESCRIPTION OF A PREFERRED EMBODIMENT

Figure 1:
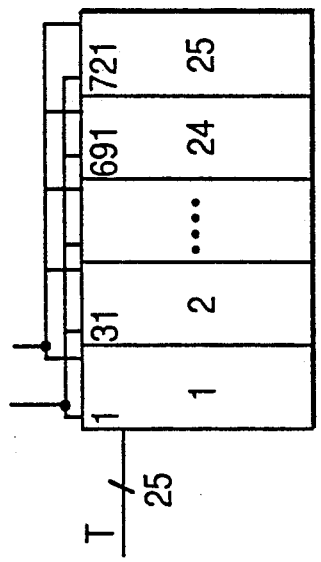
FIG. 1 illustrates schematically the actuation of the display according to the invention.

FIG. 1 shows the actuation of a liquid crystal display according to the present invention. The liquid crystal display is divided into 25 blocks numbered 1 to 25, each block having 30 vertical actuation lines. According to the invention, a video signal is transmitted in parallel to the 30 input actuation lines of each individual block, with an input clock pulse T for switching over to the next block after all of the vertical lines defining columns of a block have been written.

In the known multiplex operation, each pixel in a block would require the time of $p_{pixel} = 64 \mu s/25 = 2.5 \mu s$. Due to the inventive division of the actuation of the liquid crystal electrodes according to the invention, a sufficient and longer period of time is realized for the actuation of the pixels than in the prior art.

One possible actuation of the pixel electrodes is by directly charging the column capacitors of a block. Especially in the case of LCD displays with fewer columns or in the case of LCD displays with high speed circuit elements, this direct actuation of a row of column capacitors block by block may be possible. However, in case of a high number of columns this requires a very high peak current which, as a whole, may be considered a drawback. Moreover, the brightness distribution is not uniform over the entire width of the liquid crystal display since the individual columns of blocks 1 to 25 receive the video information successively and the voltage across the pixel electrodes connected to the corresponding column capacitors of the first block would have already dropped when the columns of the last block receive the video signal.

According to another embodiment of the present invention, the video signal is therefore intermediately stored in memory capacitors, and all capacitors of the individual columns are charged jointly.

Figure 2:
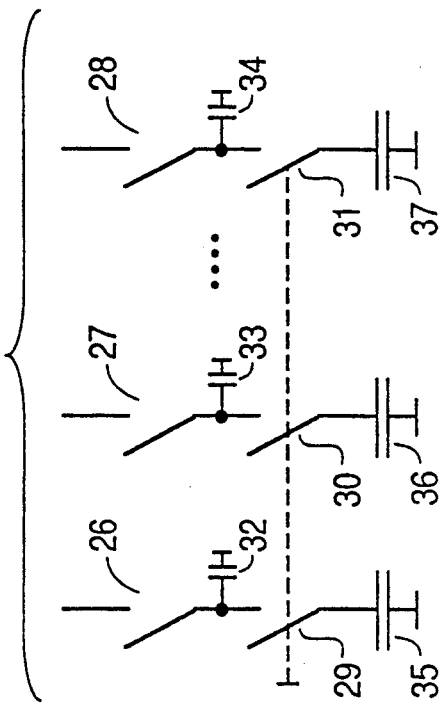
FIG. 2 is a circuit schematic illustrating an intermediate storage arrangement according to an embodiment of the invention.

FIG. 2 shows an embodiment of an intermediate storage circuit. For simplicity, FIG. 2 only shows three parts of a storage circuit, each part comprising a block switch. Block switches 26, 27, 28 receive the video signal in multiplex. That is, when a block switch is closed, the 30 vertical actuation lines of the respective block are charged simultaneously in parallel. In the multiplex operation, these switches are successively closed block by block. When block switches 26, 27, 28 are closed in succession, the respective memory capacitors 32, 33, 34 of each block are charged in succession. Once a line has been written, that is, all memory capacitors 32, 33, 34 of all blocks of a row have been charged, switches 29, 30, 31 are closed simultaneously so that memory capacitors 32, 33, 34 are simultaneously connected with column capacitors 35, 36, 37. By activation of a selection line (not shown in FIG. 2) of a respective row, the voltages stored in column capacitors 35, 36, 37 are fed line by line to the pixel elements of the display.

Figure 3:
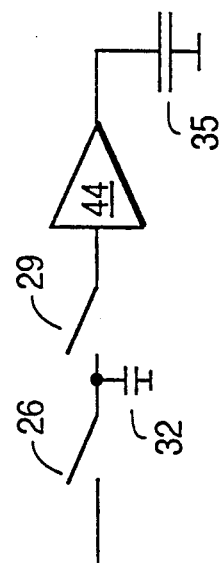
FIG. 3 is a circuit schematic illustrating an intermediate storage arrangement including a current amplifier according to the invention.

FIG. 3 shows an intermediate storage circuit for each column of a block including a current amplifier 44. Memory capacitor 32 is charged by way of switch 26. Once all memory capacitors of the memory circuits have been charged during a line period, switch 29 is closed. Current amplifier 44 amplifies the discharge current of memory capacitor 32 and feeds it to column capacitor 35.

Figure 4:
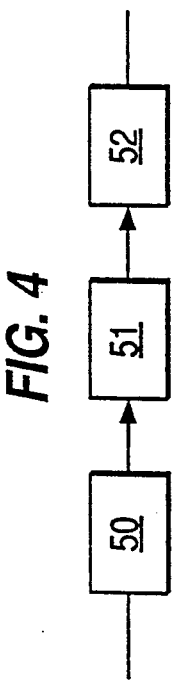
FIG. 4 is a block circuit diagram for storage, and a voltage/time/voltage conversion according to the invention.

FIG. 4 shows, as current amplifier 44, a block circuit including voltage/time/voltage conversion of a video signal. For example, for a video signal having a voltage range starting from 0 to 6 volts, the video information which represents a certain voltage value is first stored in a memory 50, is converted by way of a voltage/time converter 51 into a pulse width modulated signal 60. This pulse width modulated signal is then fed by a time/voltage conversion circuit 52 to the column capacitors.

Figure 5:
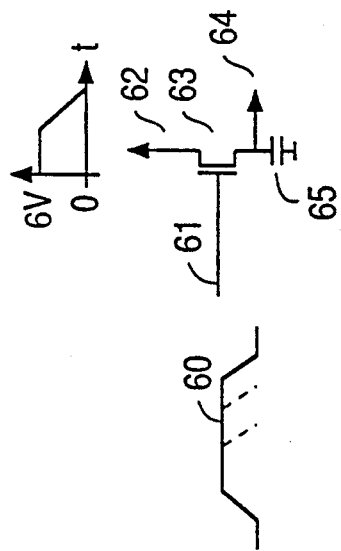
FIG. 5 is a circuit schematic illustrating a circuit for the time/voltage conversion according to FIG. 4.

As shown in FIG. 5, a time/voltage conversion circuit 52 includes a transistor 63. The pulse width modulated signal 60 produced by voltage/time converter 51 is fed through an inverter (not shown in FIGS. 3-5) to the gate 61 of transistor 63. Each column has its respective conversion circuit 52 and all the source electrodes of transistors 63 are coupled together and controlled by a master ramp signal received by the source electrodes. As a result, a voltage is present across source electrode 62 of transistor 63 which drops at a constant rate from a maximum value of, for example 6 volts, to 0 volts. Capacitor 65 corresponds to column capacitors 35, 36 or 37) and is connected to the other electrode of transistor 63 and thus, is charged by means of this ramp voltage. Advantageously, the parasitic gate/drain capacitances of the transistor switches of the non-activated rows of the same column may be utilized as column capacitors 65 (see FIG. 1a). The output 64 of column capacitor 65 is fed to the drain electrodes of the switching element in the respective column of the liquid crystal display. Depending on the magnitude of the video input voltage, a pulse of different length is received from voltage/time converter 51 so that the respective voltage can be picked up at capacitor 65.

Figure 12:
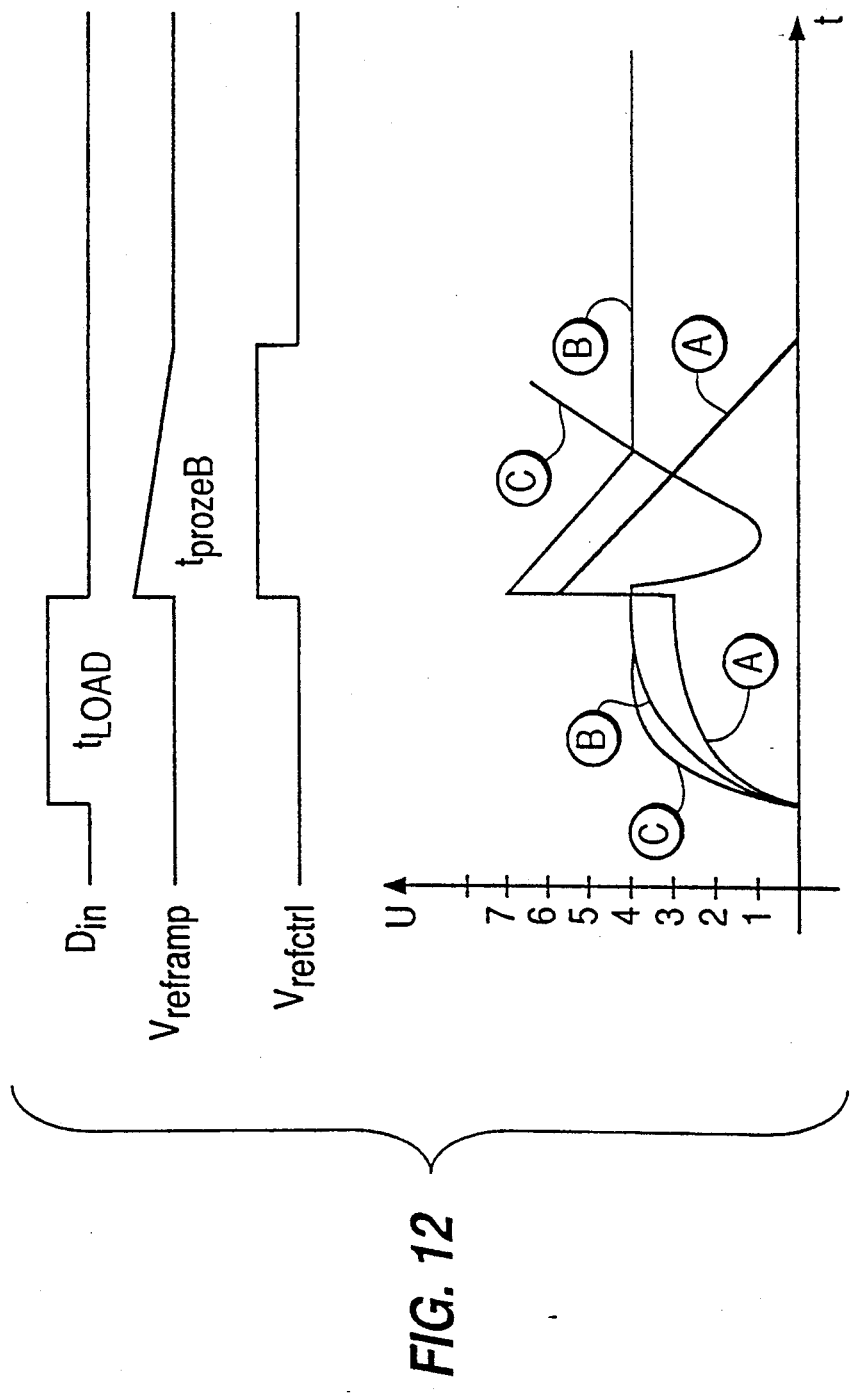
FIG. 12 is a voltage/time diagram for explaining the operation of the circuit shown in FIG. 6.

FIG. 6 shows an embodiment of a circuit for storage and voltage/time conversion of a video signal. FIG. 12 shows the associated voltage v. time diagram. By way of an input 77, the signal to be displayed is fed to the source or drain electrode of a first transistor 70. The gate electrode of first transistor 70 receives a signal $D_{in}$, for example a clock pulse, for switching on a block. By way of another input 78, a reference voltage $V_{reframp}$ is applied to the drain or source electrode of a second transistor 75 whose gate electrode is connected with a control voltage $V_{refctrl}$ 79 for controlling reference voltage $V_{reframp}$. Both output electrodes of transistors 70 and 75 are connected with one another at a point A, which connects with a terminal of a capacitor 72. A second terminal of capacitor 72, at point B, leads to the drain/source electrode of a third transistor 71 and to the gate electrode of a fourth transistor 73. The gate electrode of third transistor 71 is connected with a line receiving signal Din for switching to the next block. One electrode of fourth transistor 73 is connected to ground. The other electrode of fourth transistor 73 is connected with a second electrode of third transistor 71 and with a drain/source electrode of fifth transistor 74 at a point C. This common connection point C leads to an 76 of the circuit which furnishes an output signal (invested) to the circuit 52 for time/voltage conversion, e.g. as shown in FIG. 5. FIG. 1b shows a circuit SC which comprises the circuit of FIG. 6 having its output on line 76 pass through an inverter I as mentioned above. Fifth transistor 74 has its input electrode connected with a supply voltage UV. This supply voltage UV is simultaneously applied to the gate electrode of fifth transistor 74. Capacitor 72 corresponds to memory capacitors 32, 33, 34 of FIG. 2 and serves to intermediately store the video signal.

The transistors 70, 71, 73, 74, 75 can be either a FET or TFT transistor depending upon the desired parameters/functions of the transistor. At the beginning of a charging time $t_{load}$, both the first and third transistors 70, 77 are conductive. Thus, an equilibrium voltage appears at point B, which depends only on the dimensions of the parameters of the fourth and fifth transistors 73, 74, for example, the width of the channel of the FET transistors employed. This circuit serves as an inverter and quickly switches the fourth transistor 73 on and off. For this purpose, the invention provides that the channel of fifth transistor 74 is selected to be as small as possible, and that the channel of fourth transistor 73 is as large as possible. Now, capacitor 72 is charged at point A with the data voltage. Once capacitor 72 is charged, the first and third transistors 70 and 71 are switched off and the reference voltage $V_{reframp}$ is applied to point A via second transistor 75.

The voltage at point B changes as follows:

$$U_B = U_{BO} + U_{ramp} - U_{data}$$

In this case, $U_{BO}$ is the voltage that appears when third transistor 71 is conductive, i.e., the voltage generated due to the dimensions of the fourth and fifth transistors 73, 74 at point C. Thus an equilibrium voltage develops. Based on a reference voltage $U_{ramp}$ of 6 volts that drops constantly to 0 volts and a data voltage $U_{data} = 3$ volts, the following voltage appears at point B:

$$U_B = 4\ V + 6\ V - 3\ V = 7\ V$$

Since, in the time now following, capacitor 72 is hardly not discharged, voltage UB follows the reference ramp voltage applied at input 78 approximately parallel as a function of the first applied data volta $U_{data}$.

If voltage UB becomes smaller than UBO, the fourth transistor 73 switches off and the voltage at point C increases rapidly. This voltage at point C is inverted with the aid of an inverter (not shown) and is utilized to control transistor 63 of the time/voltage conversion circuit of FIG. 5.

Thus, the pulse width modulation signal produced at point C is dependent on the data voltage $V_{data}$ at point B and switches off the fourth transistor 73 earlier or later. Voltage curves A, B, C shown in FIG. 12 correspond, for the above example, to the voltages detected at points A, B, C over a period of time.

FIG. 8 shows the loading and processing of a line as performed in FIG. 6. During the 64 µs activation time of a line, the 25 blocks 1 to 25 are charged with the data signal during the respective time periods $t_{load1}'\ldots load25$. The total charging time for the memory capacitors of the blocks is shorter than the 64 µs time duration for the entire line. Assuming that the processing time $t_{process} = 20$ µs, this results in a charging time of 1.7 µs for each memory capacitor 72.

Figure 7:
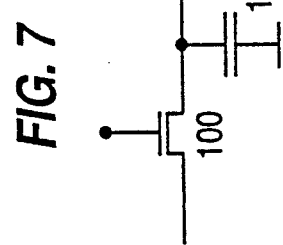
FIG. 7 is a circuit schematic showing a prestage memory circuit according to the invention.

FIG. 7 shows a prestage circuit for the circuit of FIG. 6. The input data of video signals to be displayed can be fed to a transistor 100.

The gate electrode of transistor 100 is actuated for intermediate storage by a control signal which is applied to each block of gate electrodes block by block. The voltage representing the input video data is stored in a capacitor 101. This information stored as a voltage value is then fed to the input 77 of the circuit of FIG. 6.

Thus, all capacitors 101 in the 25 prestage circuits of the blocks are initially charged successively and then the data are transferred together into a respective storage and voltage/time conversion circuit of FIG. 6.

Figure 11:
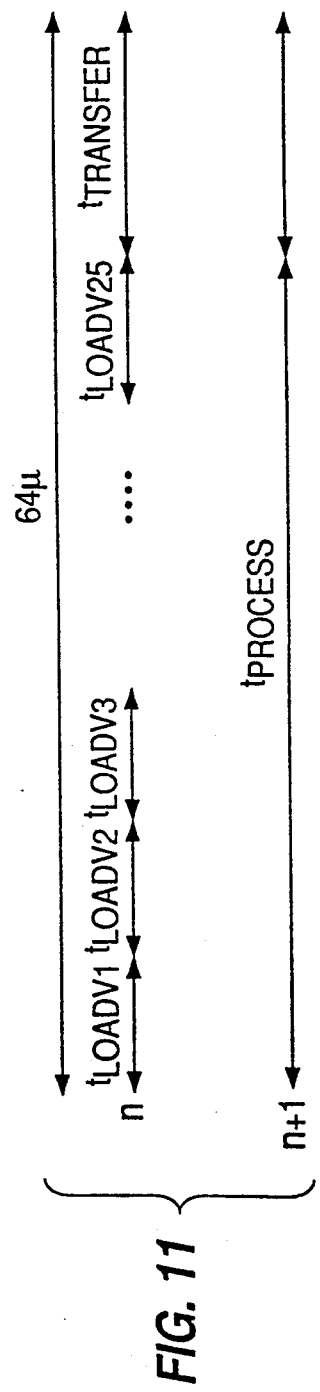
FIG. 11 is a third time diagram used to explain the invention.

During the charging of capacitors 101 in the prestage circuit of a line n, the processing of the data of line n+1 takes place simultaneously as shown in FIG. 11. That is, all capacitors 72 of a row are loaded in line n+1 simultaneously from respective capacitors 101. The transfer time $t_{transfer}$ of FIG. 11 corresponds to the time available to the circuit of FIG. 6 for charging capacitor 72 and corresponds, for example, to the time $t_{load1}$ of FIG. 8. Transistor 100 of this prestage circuit may have larger dimensions than transistors 70 and 71 so that the charging of capacitor 101 in the prestage can be effected faster than charging of capacitor 72 of the circuit of FIG. 6. The reason for the possible greater dimensions is that, due to the parasitic gate-drain and gate-source capacitances, the voltage differences resulting here when the transistor is turned off do not affect the remainder of the circuit as much as with transistors 70 and 71. With a transfer time of, for example, 5 $\mu$s, the charging time of capacitor 101 of the prestage circuit of the blocks is then 2.3 $\mu$s.

Figure 10:
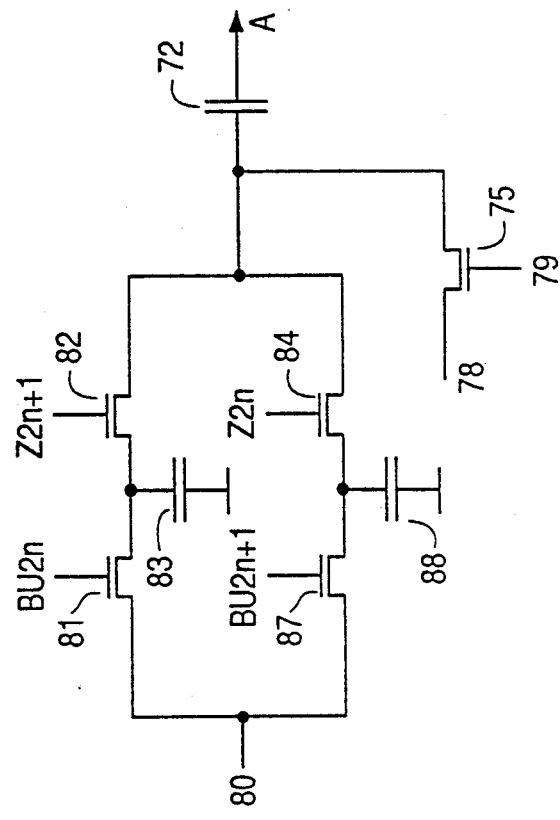
FIG. 10 is a circuit schematic of an expanded prestage circuit according to the invention.

FIG. 10 shows an expanded prestage circuit for the circuit of FIG. 6. Video data signals 80, same as received by input 77 in FIG. 6 or drain/source of transistor 700 in FIG. 7, are fed to a transistor 81 as well as to a transistor 87 which correspond to transistor 100 in FIG. 7. The input electrodes of transistors 81 and 87 are connected together. The respective other electrodes of transistors 81 and 87 are connected with capacitors 83 and 88 and also with the input electrodes of transistors 82 and 84. Capacitors 83 and 88 correspond to capacitor 101 in the prestage circuit of FIG. 7 and are charged as described below. The outputs of transistors 82 and 84 (which correspond to transistor 70 in FIG. 6) are connected jointly to memory capacitor 72 which receives the reference voltage $V_{reframp}$ via the second transistor 75, as described in FIG. 6.

With the expanded prestage circuit of FIG. 10 it is now possible to employ a whole row according to the timing chart of FIG. 9 and to charge the prestages so that a charging time $t_{load83}$, $t_{load88}$ of 2.5 $\mu$s results for both capacitors 83 and 88. Moreover, this time is completely independent of the transfer time $t_{transfer}$. *Transistor 81 is actuated by a block switching signal Bu2n received for every 2n$^{th}$ row, transistor 87 is actuated by a block switching signal Bu2n+1 received for every 2n+1$^{th}$ row, transistor 82 is actuated by means of a row switching signal Z2n+1 for each 2n+1$^{th}$ row and transistor 84 is activated by a row switching signal Z2n for each 2n$^{th}$ row. As a result of the above-described switching signals, when capacitor 83 is being loaded with voltage information, the voltage stored in capacitor 88 is discharged to memory capacitor 72 and vice versa.

*The time periods marked with numbers 1 to 25 for line n and line n+1 correspond to the time periods $t_{loadV1}$ to $t_{loadV25}$ in FIG. 11. Time period $T_f$ corresponds to time period $t_{transfer}$ in FIG. 77 and the remaining part of lines n and n+1 corresponds to $t_{process}$ in FIG. 11.

Figure 1A:
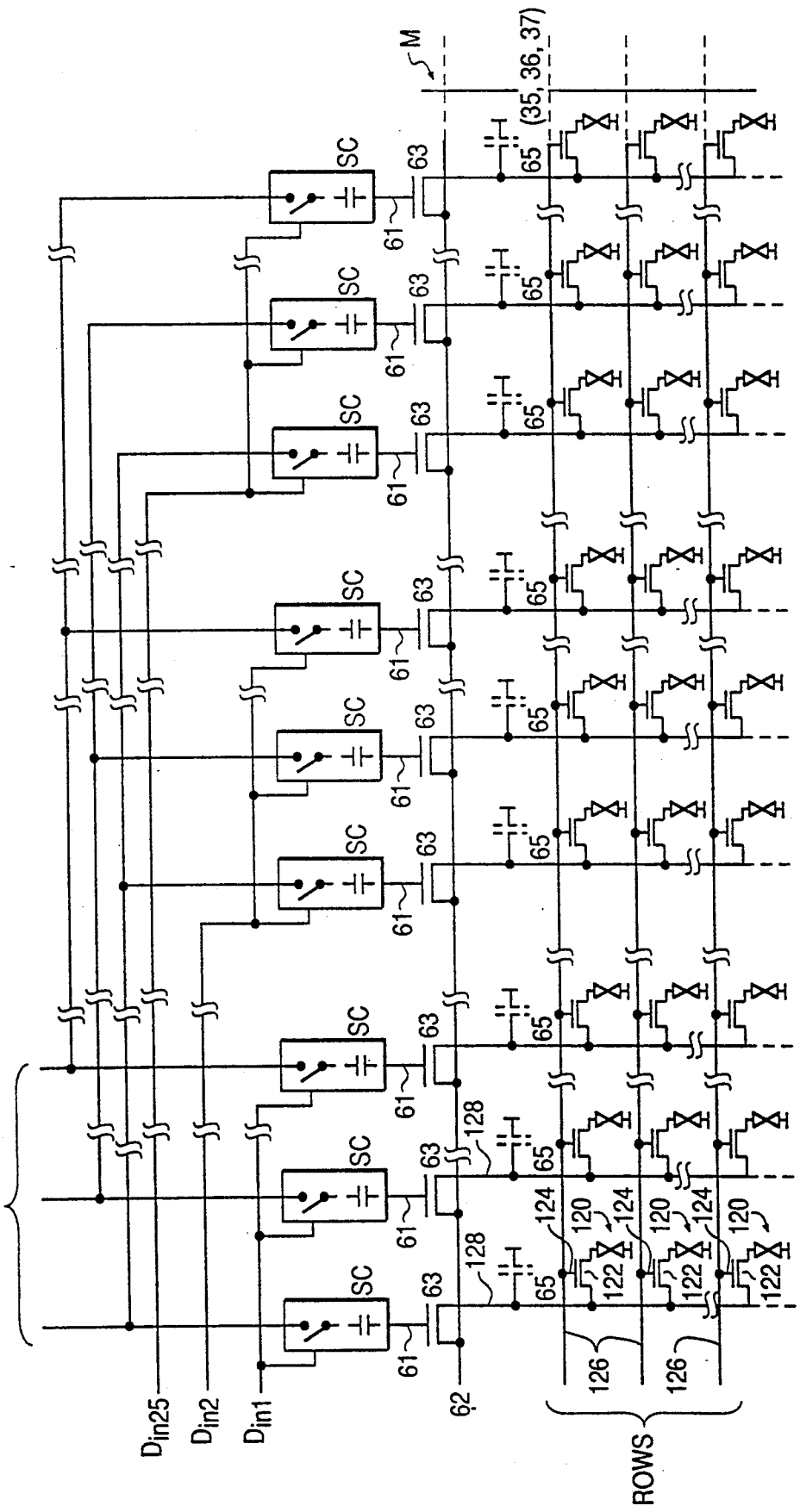
FIG. 1a is a circuit schematic, in partial block diagram, showing an embodiment of the actuating circuit connected to a matrix of pixel elements according to the invention.
Figure 1B:
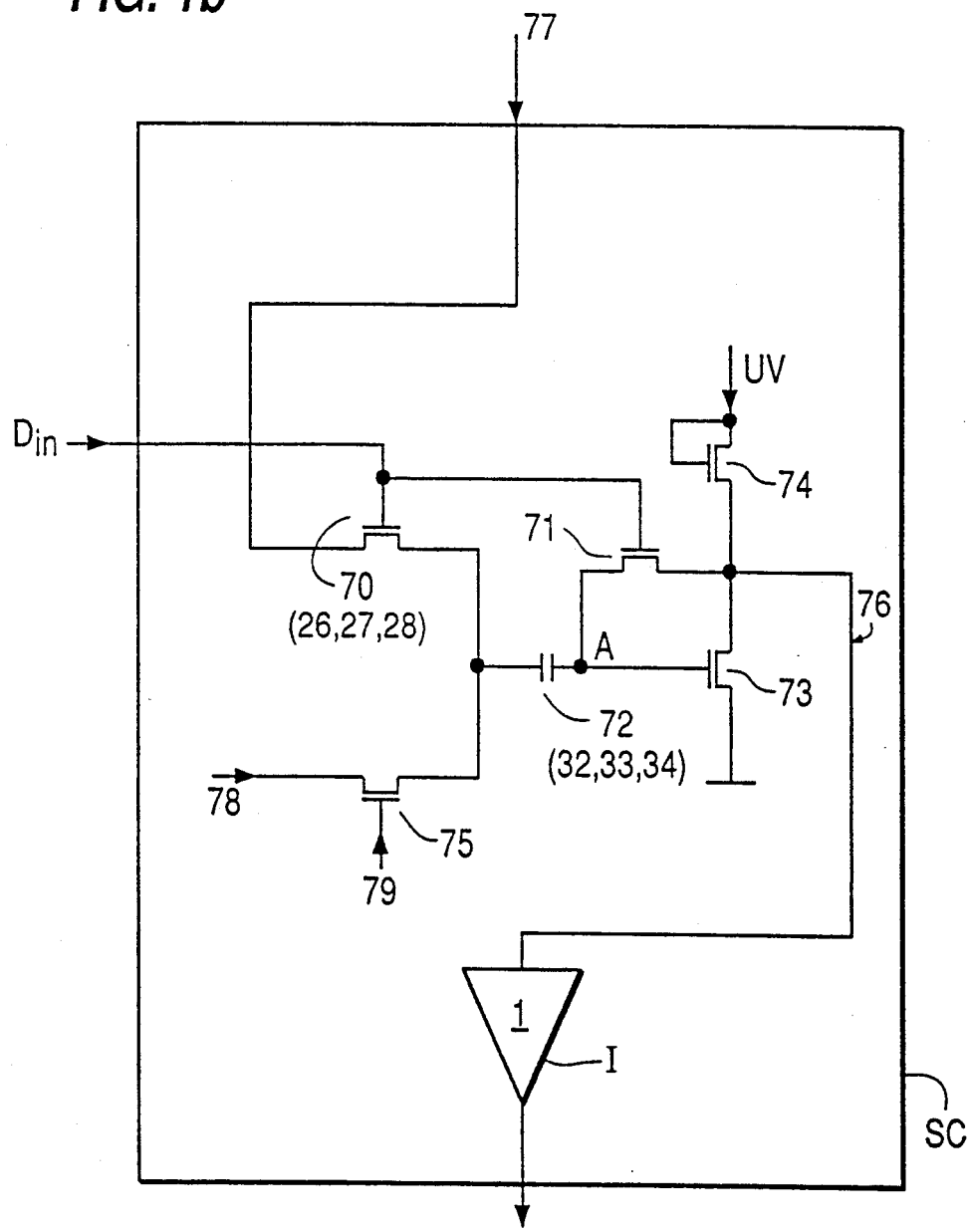

The circuit according to FIG. 6, and hence the circuit SC of FIG. 1b is contained in each of blocks 1 to 25 in correspondence with its number of columns as shown in FIG. That is, a voltage/time conversion circuit of FIGS. 1a and 6 is provided for each column of a block. The inputs of the gate electrodes of transistors 70, 71 of each column are connected in parallel block by block.

A control signal 79 is applied during a processing time after all blocks 1 to 25 have been written.

A row of the pixel elements 120 of the liquid crystal display are switched on when the corresponding line (column) electrode of the pixel element and the corresponding row electrode of the liquid crystal display which cross at the location of each pixel element are activated. After a row of pixel elements is selected, the column capacitor 65 connected to each column opf the pixel elements is discharged switching on the selected row of pixel elements.

The block switching signals BuZn and Buzn+7 correspond to signal Din of FIG. 6. During each row period the block switching signals activate serially the 25 blocks of expanded prestage circuits (FIG. 10). This means that there are 25 block switching signals per row. Row switching signals ZZn and ZZn+7 correspond to time period $T_f$ in FIG. 9.

It will be understood that the above description of the present invention is susceptible to various modifications, changes and adaptations, and the same are intended to be comprehended within the meaning and range of equivalents of the appended claims.

What is claimed is:

1. An actuation circuit for a liquid crystal display, comprising:
    a plurality of actuation lines arranged in columns and a plurality of selection lines arranged in rows intersecting the columns;
    a matrix of pixel elements each being operatively connected at an intersection of the columns and rows of said actuation and selection lines, respectively, said columns of actuation lines being grouped in a number of separate blocks of actuation lines;
    a plurality of column capacitors each coupled to a respective one of said actuation lines;
    a plurality of data lines for receiving data signals and feeding the data signals in parallel to the actuation lines of a respective block of actuation lines;
    a plurality of storage capacitor means each connected to an actuation line and coupled with a respective one of said data lines for intermediately storing data signals to be displayed;
    first switch means coupled between said data lines and said plurality of storage capacitor means for successively switching data signals on said data lines to the respective storage capacitor means of one block of actuation lines and then to the respective storage capacitor means of a following block of actuation lines until all storage capacitor means are charged with data signals; and
    second switch means coupled between the respective storage capacitor means and said column capacitors for charging all column capacitors simultaneously in parallel after all storage capacitor means of all blocks of actuation lines have been charged by data signals.

2. An actuation circuit as defined in claim 1, further comprising voltage/time conversion means, operatively connected to the output of each storage capacitor means, for converting the signal received by the storage capacitor means into a pulse width modulator signal which is fed to the respective column capacitor by way of said second switch means.

3. An actuation circuit as defined in claim 1, wherein the first switch means comprises a first transistor arrangement having a first transistor for each column of a block; and each column of said actuation circuit further comprises second, third, fourth and fifth transistors, each transistor having a gate electrode and input and output electrodes, the output electrodes of said first transistor and said second transistor being connected together at a first connection point and one terminal of the storage capacitor means being connected to the first connection point; the other terminal of the storage capacitor means being connected to a second connection point, and the input electrode of said third transistor and the gate electrode of said fourth transistor are connected to the second connection point; and the output electrode of said third transistor and the input electrode of said fourth transistor are connected together at a third connection point which is coupled to the output electrode of the fifth transistor, the input electrode and gate electrode of the fifth transistor being connected to a supply voltage, wherein the signal to be displayed is input to the input electrode of said first transistor of a block when the gate electrode of said first transistor receives a block switching signal turning that block on, and the signal to be displayed charges the storage capacitor means.

4. An actuation circuit as defined in claim 3, wherein the first transistor arrangement is a transistor.

5. An actuation circuit as defined in claim 3, wherein the transistors are FET transistors.

6. An actuation circuit as defined in claim 3, wherein the transistors are TFT transistors 7. An actuation circuit as defined in claim 3, wherein the fifth transistor has a channel which is selected to be as small as possible and the fourth transistor a channel which is selected to be as large as possible.

8. An actuation circuit as defined in claim 3, wherein, after charging the storage capacitor means, the first and third transistors are switched off and the reference voltage applied by the second transistor is a ramp voltage.

9. An actuation circuit as defined in claim 3, wherein the first transistor arrangement for each column of a block further comprises a sixth transistor having an output electrode coupled to the input electrode of the first transistor and an associated capacitor connected at one terminal to the output electrode of the sixth transistor, the other terminal of which being coupled to ground; and during a charging period determined by the block switching signal, the signal to be displayed for each data line is fed block by block via the sixth transistor to the associated capacitor of each column; and after the associated capacitors of each block have been charged block by block, the stored data are fed line by line to the input of the first transistor.

10. An actuation circuit as defined in claim 3, wherein the first transistor arrangement comprises a parallel circuit including a first branch comprising the first transistor, a sixth transistor having an output electrode coupled to the input electrode of the first transistor, and a first associated capacitor coupled between the sixth transistor and the input electrode of the first transistor, one terminal of the first associated capacitor being connected to the output electrode of the sixth transistor, the other terminal being connected to ground; and a second branch including a seventh transistor, a second associated capacitor having one terminal connected to the output electrode of the seventh transistor, the other terminal being coupled to ground, and an eighth transistor having an input electrode coupled to the output electrode of said seventh transistor and connected to the one terminal of the second associated capacitor and an output electrode coupled to the output electrode of said first transistor, wherein the gate electrodes of the first, sixth, seventh and eighth transistors are coupled to receive switching signals, and the signal to be displayed is input to the input electrodes of said sixth and seventh transistors, the first and second associated capacitors being respectively charged with the data signal when the sixth and seventh transistor respectively receive a switching signal, the first and second associated capacitors being respectively discharged to charge the storage capacitor means when the first and eighth transistors respectively receive a switching signal.

11. An actuation circuit as defined in claim 1, wherein said column capacitors comprise stray capacitances present in the respective columns of the matrix.

* * * * *

UNITED STATES PATENT AND TRADEMARK OFFICE
CERTIFICATE OF CORRECTION

PATENT NO. : 5,206,632

DATED : April 27th, 1993

INVENTOR(S) : DUPONT et al.

It is certified that error appears in the above-identified patent and that said Letters Patent is hereby corrected as shown below:

On the title page:

Item (75): fourth inventor, please change Schwenninen to Schwenningen.

Signed and Sealed this

Thirtieth Day of November, 1993

Attest:

BRUCE LEHMAN

Attesting Officer

Commissioner of Patents and Trademarks